US012306140B2

(12) United States Patent
Harle et al.

(10) Patent No.: US 12,306,140 B2
(45) Date of Patent: May 20, 2025

(54) METHODS AND DEVICES OF DETECTING FRICTIONAL INTERFERENCE OF A MECHANICAL COMPONENT WITHIN A VEHICLE

(71) Applicant: The Boeing Company, Chicago, IL (US)

(72) Inventors: John William Harle, Los Angeles, CA (US); Michael James Bunting, II, Long Beach, CA (US)

(73) Assignee: THE BOEING COMPANY, Arlington, VA (US)

( * ) Notice: Subject to any disclaimer, the term of this patent is extended or adjusted under 35 U.S.C. 154(b) by 327 days.

(21) Appl. No.: 17/519,836

(22) Filed: Nov. 5, 2021

(65) Prior Publication Data
US 2022/0163490 A1 May 26, 2022

Related U.S. Application Data

(60) Provisional application No. 63/116,398, filed on Nov. 20, 2020.

(51) Int. Cl.
*G01N 29/46* (2006.01)
*B64F 5/60* (2017.01)
*G01N 19/02* (2006.01)
*G01R 19/165* (2006.01)
*G01P 15/18* (2013.01)

(52) U.S. Cl.
CPC .............. *G01N 29/46* (2013.01); *B64F 5/60* (2017.01); *G01N 19/02* (2013.01); *G01R 19/16533* (2013.01); *G01P 15/18* (2013.01)

(58) Field of Classification Search
CPC .......... G01N 29/46; G01N 19/02; B64F 5/60; G01R 19/16533; G01P 15/18
See application file for complete search history.

(56) References Cited

U.S. PATENT DOCUMENTS

| 9,489,341 | B1 | 11/2016 | Ly et al. | |
|---|---|---|---|---|
| 2010/0250047 | A1* | 9/2010 | Balasu | B60T 17/221 701/31.4 |
| 2011/0050244 | A1* | 3/2011 | Knoop | G05B 23/0256 324/503 |
| 2019/0337409 | A1* | 11/2019 | Demont | B64D 27/24 |

OTHER PUBLICATIONS

Pulseng, "PulseNG Sensor", Retrieved from the internet: URL: https://www.montronix.com/en/products/functionality/sensors/pulseng-en-2.html?tmpl=component&print=1 [retrieved on Sep. 23, 2020]; pp. 1-3.

\* cited by examiner

*Primary Examiner* — Aryan E Weisenfeld
*Assistant Examiner* — Jeffrey R Chalhoub
(74) *Attorney, Agent, or Firm* — COATS & BENNETT, PLLC

(57) ABSTRACT

Methods and devices for detecting frictional interference of one or more mechanical components within a vehicle that are driven by an electric motor. The testing includes: determining that an amount of current drawn by the electric motor while driving the one or more mechanical components is above a predetermined threshold; detecting vibrations caused by the one or more mechanical components while being driven by the electric motor; analyzing the vibrations by a Fast Fourier Transform (FFT); and based on an output from the FFT, determining the frictional interference of the one or more mechanical components.

20 Claims, 7 Drawing Sheets

METHODS AND DEVICES OF DETECTING FRICTIONAL INTERFERENCE OF A MECHANICAL COMPONENT WITHIN A VEHICLE

RELATED APPLICATIONS

This application claims priority from U.S. Provisional App. No. 63/116,398, filed 20 Nov. 2020, the disclosure of which is incorporated by reference herein in its entirety.

TECHNOLOGICAL FIELD

The present disclosure relates generally to identifying frictional interference caused by one or more moving parts and, more specifically, to identifying frictional interference based on analyzing the vibrations with a Fast Fourier Transform (FFT).

BACKGROUND

Vehicles such as aircraft include one or more movable flight control members to control the vehicle during flight. Flight control members can include but are not limited to flaps on the trailing edges of the wings and slats on the leading edges. Movement of the flight control members is typically affected by one or more actuators mechanically coupled between a base (e.g., a wing spar) and the flight control member. Various types of actuators can be used to move the flight control members, including but not limited to linear actuators, rotary actuators, gear boxes, and ball-and-screw actuators. In some examples, the actuators are driven by a hydraulic system. Electrical motors are also configured to move the flight control members during certain events.

The flight control members can become jammed or otherwise not move properly during a flight. In some instances, this is caused by the forces applied on the flight control members during take-offs and landings, and can further be exacerbated due to vibrations that occur during flight. During flight, one or more indicators are provided to the aircraft personnel informing of the issue and (if appropriate) the need for immediate attention. After the aircraft has returned to the ground, determining the cause of the jamming or improper movement can be difficult to trace, for example owing to in-flight conditions that are difficult to replicate or simulate when the aircraft is on the ground. In other words, it is often because forces that are applied to the flight control members during flight are not encountered when the aircraft is back on the ground which makes identifying the problem more difficult.

Current processes to address the issue can be very time consuming requiring technicians to disassemble and inspect the elements of the transmission system. Accurately identifying the problem often requires technicians with a high degree of skill and experience to visually and manually feel and detect the friction in the transmission system. In some instances to reduce aircraft out-of-service time, the process can simply include replacing one or more, or all, of the components in the transmission system, even those that are not faulty. This is an expensive and time-consuming process but has been more effective in ensuring that the issue has been resolved.

SUMMARY

One aspect is directed to a method of detecting frictional interference of one or more mechanical components within a vehicle that are driven by an electric motor. The method comprises: determining that an amount of current drawn by the electric motor while driving the one or more mechanical components is above a predetermined threshold; detecting vibrations caused by the one or more mechanical components while being driven by the electric motor; analyzing the vibrations by a Fast Fourier Transform (FFT); and based on an output from the FFT, determining the frictional interference of the one or more mechanical components.

In another aspect, the method further comprises determining the current drawn by the electric motor over an initial period when the one or more mechanical components are first driven by the electric motor.

In another aspect, the method further comprises determining an indicator error when the amount of current drawn by the electric motor is below the predetermined threshold.

In another aspect, the method further comprises detecting the vibrations after determining the amount of current drawn by the electric motor is above the predetermined threshold.

In another aspect, detecting the vibrations while the one or more mechanical components are driven by the electric motor comprises detecting the vibration signals from one or more 3-axis accelerometers.

In another aspect, the method further comprises based on the output from the FFT, identifying the one or more mechanical components based on individual vibrational frequencies.

In another aspect, the method further comprises based on the output from the FFT, determining that the magnitude of the individual vibrational frequency of the mechanical component is above a predetermined threshold and identifying the mechanical component for replacement.

In another aspect, the method further comprises determining that the magnitude of the individual vibrational frequency of the mechanical components is below a predetermined threshold and identifying the mechanical component as acceptable to remain in the vehicle.

In another aspect, the one or more mechanical components are flight control members on an aircraft.

In another aspect, the method further comprises receiving a command from a flight control input located in a cockpit of the aircraft prior to determining the amount of current drawn by the electric motor.

One aspect is directed to a method of detecting frictional interference of one or more mechanical components within a vehicle that are driven by an electric motor. The method comprises: determining an increase in current drawn by the electric motor while driving the one or more mechanical components; after determining the increased current, analyzing with a Fast Fourier Transform (FFT) vibrations of the one or more mechanical components while being driven by the electric motor; and based on an output from the FFT, identifying the frictional interference caused by the one or more mechanical components based on individual vibrational frequencies.

In another aspect, the method further comprises determining that one of the mechanical components is causing the frictional interference to be above a predetermined threshold based on the individual vibrational frequency of the mechanical component.

In another aspect, the method further comprises receiving magnitudes and frequencies of the vibrations over time from one or more 3-axis accelerometers.

In another aspect, the method further comprises determining the vibrations of one of the mechanical components based on readings from a sensor that is attached to just the mechanical component.

In another aspect, the method further comprises the one or more mechanical components are flight control members of an aircraft.

One aspect is directed to a device to detect frictional interference of moving mechanical components that are driven by an electric motor. The device comprises one or more vibration sensors, and a control unit comprising processing circuitry and memory circuitry. The control unit is configured to: detect that current drawn by the electric motor while driving the mechanical components is above a predetermined threshold; receive signals from the one or more sensors indicative of vibrations of the mechanical components that are being driven by the electric motor; analyze the signals using a Fast Fourier Transform (FFT); and identify the frictional interference caused by the mechanical components based on individual vibration frequencies of the mechanical components.

In another aspect, the one or more vibration sensors are three-axis accelerometers.

In another aspect, a housing extends around the control unit, and a handle is attached to the housing for grasping by a user when transporting the device.

In another aspect, the one or more sensors and the control unit are integrated into an aircraft.

In another aspect, the control unit if further configured to receive an input from a cockpit of the aircraft prior to detecting the current drawn by the electric motor.

The features, functions and advantages that have been discussed can be achieved independently in various aspects or may be combined in yet other aspects further details of which can be seen with reference to the following description and the drawings.

DETAILED DESCRIPTION

The present disclosure is directed to systems and methods of testing a vehicle by detecting mechanical frictional interference of one or more driven components 59 that move a member 90 on the vehicle. The components 59 cause friction during movement of the member 90 that could cause performance issues with the operation of the member 90. The testing identifies the one or more components 59 causing frictional interference and provides for repair and/or replacement.

Figure 1:
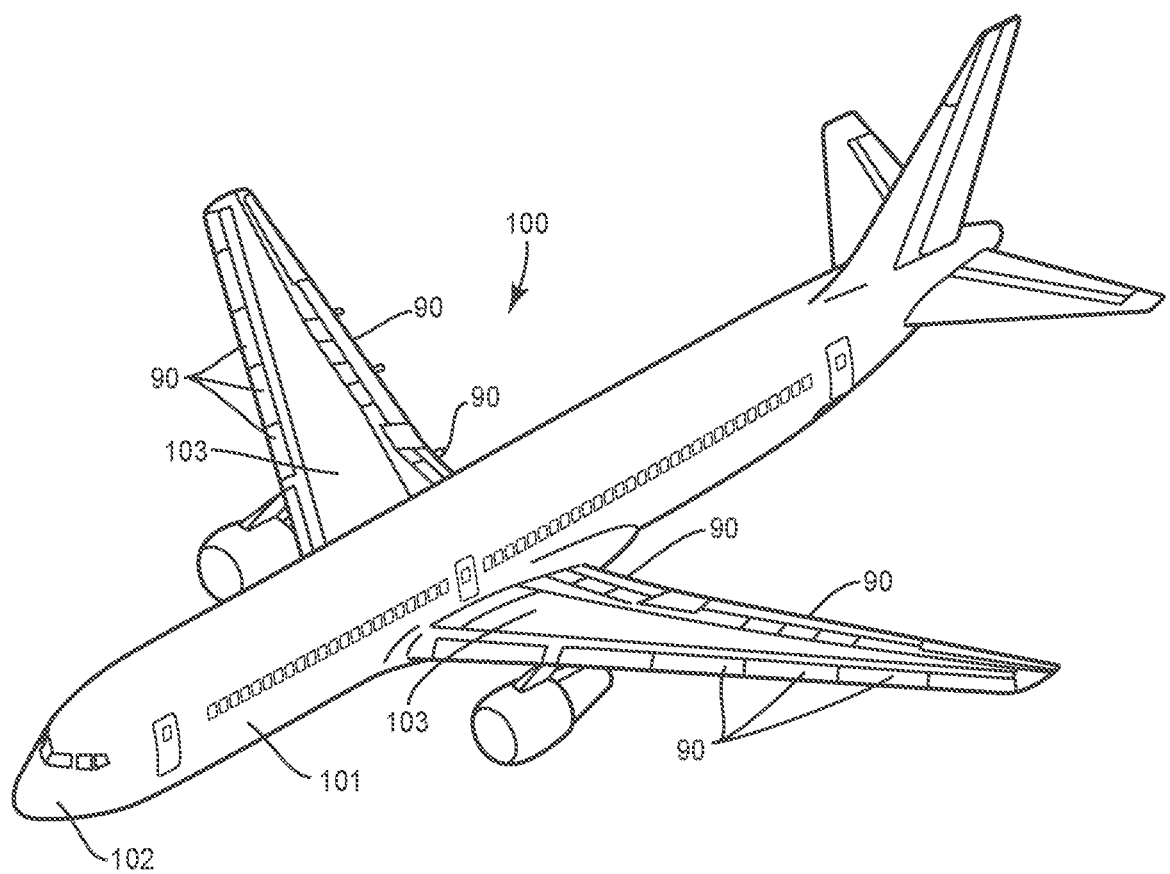
FIG. 1 is a perspective view of an aircraft.

FIG. 1 illustrates one example of a vehicle 100 for which the systems and methods are applicable for detecting frictional interference during movement of one or more members 90. FIG. 1 includes the vehicle in the form of an aircraft 100 and the members 90 in the form of flight control members 90, namely slats and flaps on the leading and trailing edges of the wings.

The systems and methods are applicable to a variety of different aircraft 100. The aircraft 100 of FIG. 1 includes a fuselage 101 with a cockpit 102. Wings 103 extend outward from the fuselage 101 and include the flight control members 90. Inboard flight control members 90 are located closer to the fuselage 101 and center of the aircraft 100, and outboard flight control members 90 are located farther away from the fuselage 101 and center of the aircraft 100. The flight control members 90 are movable relative to the wings 103 to change their orientation, to control the flight. Operation of the flight control members 90 occurs through input devices 105 (see FIG. 3) located in the cockpit 102 and used by the flight personnel during operation of the aircraft 100.

Figure 2:
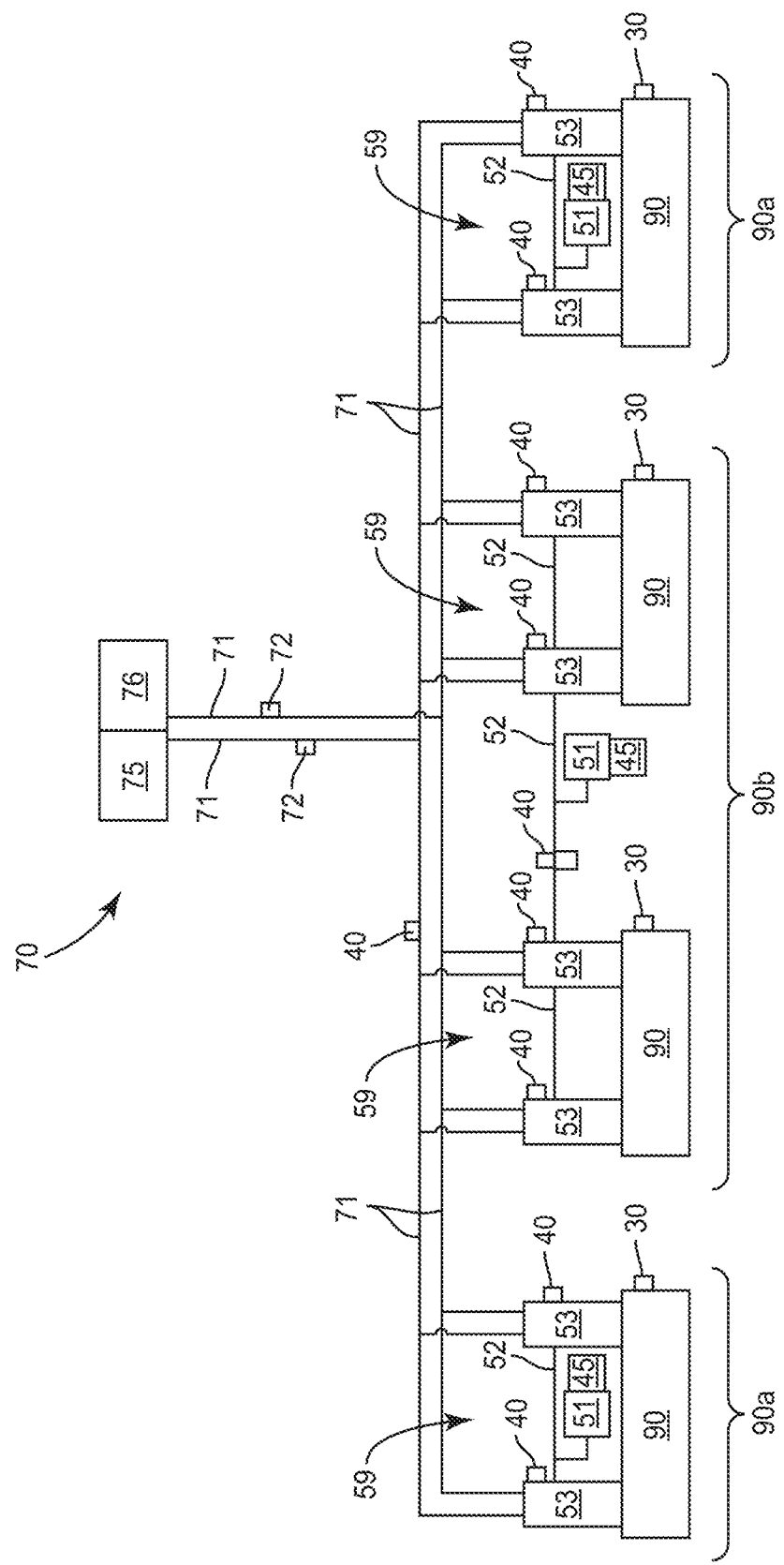
FIG. 2 is a schematic diagram of a system for operating flaps on an aircraft.

FIG. 2 schematically illustrates a system within the aircraft 100 that controls the flaps 90 that are positioned on the trailing edges of the wings 103. The flaps 90 are moved by actuators 53 that extend and retract to control the orientation of the flaps 90 relative to the wings 103. The actuators 53 in turn are controlled through a hydraulic system 70 that includes hydraulic lines 71, valves 72, reservoirs 75, and pumps 76. The hydraulic system 70 moves hydraulic fluid through the hydraulic lines 71 and to and from the actuators 53, to control the movement of the flaps 90. The valves 72 are positioned along the hydraulic lines 71 to control the movement of the hydraulic fluid. The valves 72 can include shut-off valves that prevents the flow of hydraulic fluid along the hydraulic fluid lines 71, rate valves that control the rate at which the hydraulic fluid moves through the hydraulic fluid lines 71, and directional valves that control the direction in which the hydraulic fluid is moved along the hydraulic lines 71, including directing the hydraulic fluid to and from the actuators 53.

The actuators 53 are also driven by electric motors 51. The electric motors 51 provide backup functionality to adjust the flaps 90 in the event of an issue with the hydraulic system 70. The electric motors 51 can also be used for a slow adjustment speed of one or more of the flaps 90. For example, during a high speed cruise of the aircraft 100 when a high speed adjustment of one or more of the flaps 90 is not desired, the electric motors 51 provide a slow speed adjustment. In one example, the motor 51 is a 3-phase AC induction motor.

The electric motors 51 can cause movement of one or more mechanical components 59. The components 59 can be those driven by the electric motors 51 that in turn drive the actuators 53. The components 59 can include synchronization members that synchronize the movement of the actuators 53. The components 59 can also include, but are not limited to, gearboxes, levers, screws, and various other mechanical components that transfer the power from the electric motors 51 to the actuators 53 and/or are otherwise moved during operation of the electric motor 51. The components 59 can also be included on the electric motors 51, such as but not limited to ball bearings within the motor 51. The components 59 can also include aspects of the member 90 itself, such as a bushing or bearing on a flap, or rails along which the flaps move during extension and/or retraction.

One or more sensors 30 detect a position of the flaps 90 relative to the wings 103. Various types of sensors 30 can be used to detect the position, including but not limited to motor controllers associated with the motors 51, and visual systems.

One or more sensors 40 are positioned to detect vibrations of the one or more components 59. In one example, the sensors 40 are attached directly to one of the components 59, such as through a magnetic interface on the sensor 40 that attaches directly to the surface of the component 59. Sensors 40 can also be attached to sections of the aircraft 100 in proximity to a mechanical component 59. In one example, a sensor 40 is positioned on a bracket that mounts the mechanical component 59 to the frame of the aircraft 100. In the various examples, the sensors 40 are positioned to detect vibrations caused by one or more mechanical components 59 during operation of the electric motor 51.

The number and/or spacing of the sensors 40 used during the testing can vary. In one example, the testing uses a single sensor 40 to detect vibrations of one or more components 59. In another example, the testing uses two or more sensors 40 to detect the vibrations of one or more components 59.

The testing can use various types of vibration sensors 40. One example is a low frequency three-axis accelerometer that measures vibration in g's (m/s$^2$). One specific example of a 3 axis accelerometer is the PulseNG accelerometer (available from Montronix GmbH). In testing methods with multiple sensors 40, the testing can use the same or different types of sensors 40.

Figure 3:
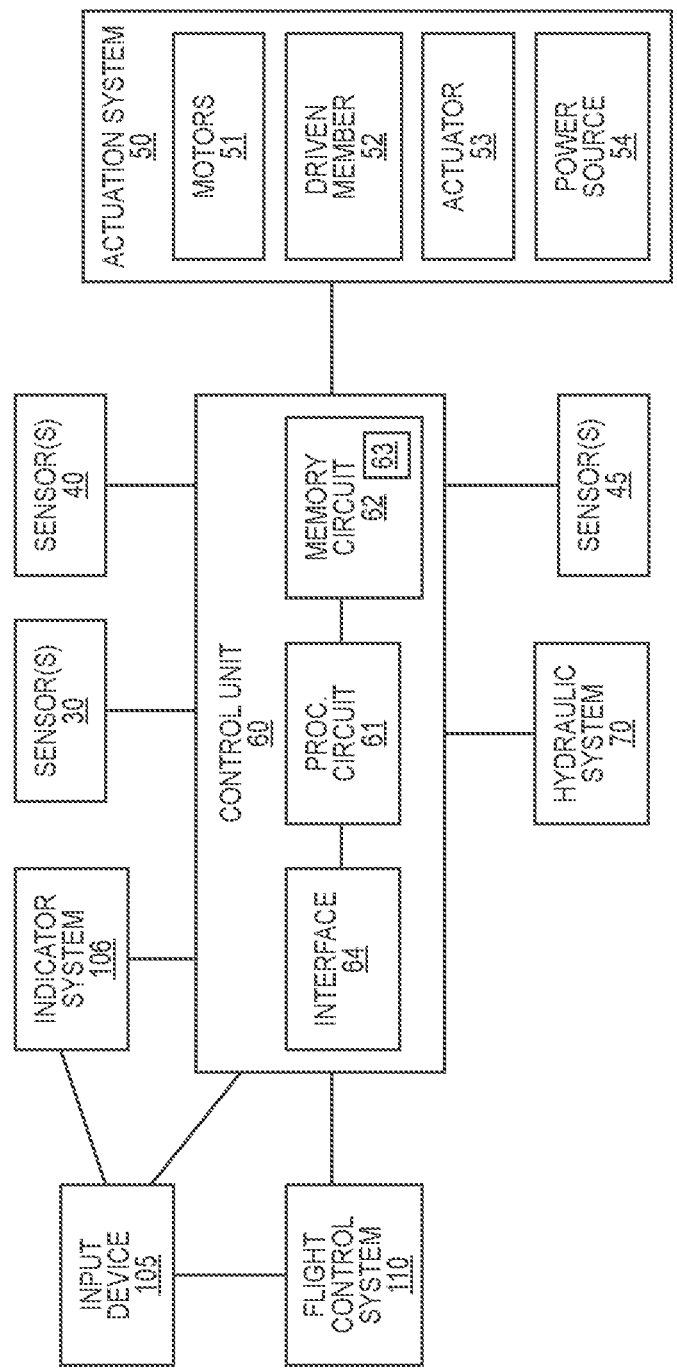
FIG. 3 is a schematic diagram of a control unit for testing mechanical interference of moving components.

In one example as illustrated in FIG. 3, a control unit 60 receives signals from the one or more sensors 40. In one example, the control unit 60 and sensors 40 are integrated within the aircraft 100. In another example, the control unit 60 and sensors 40 are independent from the aircraft 100 and connected to the aircraft 100 during the testing.

FIG. 3 illustrates an example with the control unit 60 integrated in the aircraft 100. The control unit 60 includes processing circuitry 61 that includes one or more microprocessors, Application Specific Integrated Circuit (ASICs), or the like, configured with appropriate software and/or firmware. A computer readable storage medium (shown as memory circuitry 62) stores data and computer readable program code that configures the processing circuitry 61 to implement the techniques described herein. Memory circuitry 62 is a non-transitory computer readable medium, and can include various memory devices such as random access memory, read-only memory, and flash memory. One or more program instructions 63 stored in the memory circuitry 62 are executed by the processing circuitry 61 to perform the testing methods described herein. An interface 64 includes one or more input devices and displays that are utilized by a technician during the testing.

The control unit 60 communicates with a flight control system 110 that controls one or more functions of the aircraft 100. In one example, the flight control system 110 operates primary and secondary systems of the aircraft 100. The primary system includes the ailerons, elevator, and rudder, with the secondary system including the flaps, slats, spoilers, and trim systems. FIG. 3 shows the control unit 60 as being separate from the flight control system 110. In another example, the functioning of the control unit 60 is integrated with the flight control system 110.

Inputs from the flight personnel to adjust the position of the flaps 90 are received from one or more input devices 105 located in the cockpit 102 (as shown in FIG. 1). The input devices 105 can include various configurations, such as but not limited to levers, knobs, and keypads. The inputs can be received by the control unit 60 directly from the input device 105, or via the flight control system 110.

An indicator system 106 monitors the operation and positioning of the flight control members 90. The indicator system 106 can receive signals from the sensors 30 that detect the position of the flaps 90. The indicator system 106 also receives the input commands from the input devices 105. The indicator system 106 monitors the control of the flaps 90 based on differences between the commanded and actual positions of the flaps 90. The indicator system 106 can signal one or both of the control unit 60 and flight control system 110 in the event of a discrepancy above a predetermined threshold, which may indicate a potential issue. The indicator system 106 can also determine the time necessary to move the flaps 90 to a commanded position. A time above a threshold can also be indicative of an issue and cause the indicator system 106 to send out a notification. In one example, the testing of the frictional interference occurs in response to an indication from the indicator system 106 of an issue with the positioning and/or timing of movement of the flaps 90.

The control unit 60 controls the operation of the hydraulic system 70 during testing. This includes deactivating the hydraulic system 70, such as by shutting one or more of the valves 72 and/or pumps 76. Deactivation of the hydraulic system 70 isolates the movement of the flaps 90 to the components 52 that are driven by the electric motors 51.

During testing, the control unit 60 further controls the actuation system 50 that provides for movement of the flaps 90 through the electric motors 51. The control unit 60 signals the motors 51 to control the positioning as required. The actuation system 50 can include a power source 54 to control the electric motors 51. In one example, the power sources 54 are batteries that are independent from other systems within the aircraft 100. In another example, the power source 54 also provides power to one or more other systems in the aircraft 100.

The control unit 60 receives the various inputs and detects frictional interference caused by the components 59 that are driven by the one or more electric motors 51 during movement of the flaps 90. The testing devices and methods provide for advantages over the existing methods that are currently in place. The testing methods and devices can initially determine if the issue is within the components 59 that move the flaps 90, or whether it is merely an issue with the indicator system 106 (or some other aspect not associated with the actuation system 50). Further, the testing devices and methods locate the one or more driven components 59 that are the cause of the elevated friction.

Figure 4:
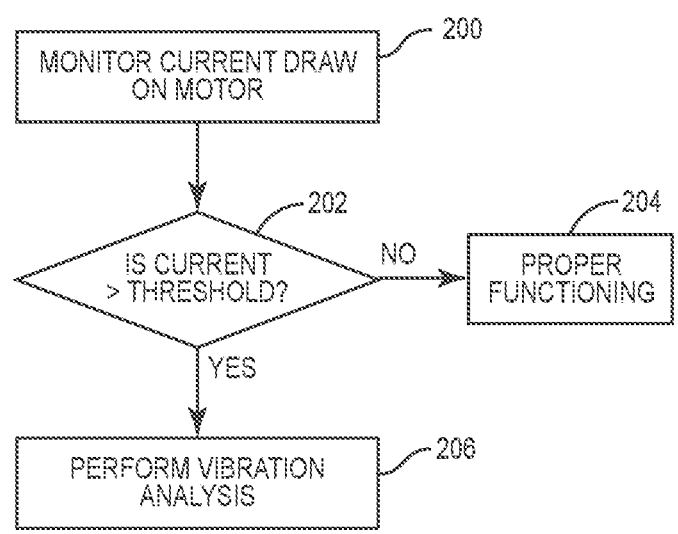
FIG. 4 is a flowchart diagram of a method of detecting frictional interference of one or more components.

FIG. 4 illustrates a method of detecting frictional interference of the components 59. In one example, the method occurs after receiving an indication of a potential issue from the indicator system 106. In another example, the method occurs periodically, such as during part of a routine maintenance program.

In this example, the method includes testing the components 59 involved with movement of the flaps 90. The testing occurs while the aircraft 100 is on the ground. Further, the hydraulic system 70 is deactivated, thus providing for just the electric motors 51 to provide the drive force for movement of the flaps 90. In one example, each of the flaps 90 is moved during the testing. In another example, one or more flap sections 90a, 90b (see FIG. 2) are deactivated such that a limited number of flaps 90 are operational. In one example, the section of the actuation system 50 controlling the flaps 90 on the left wing 103 is isolated from that controlling the right wing 103. In another example, the section of the actuation system 50 controlling the inboard flaps 90b is isolated from the section controlling the outboard flaps 90a. Various amounts of disconnecting and isolating can occur prior to the testing. In one example, each section of the actuation system 50 driven by a single motor 51 is independently tested. Using the example of FIG. 2, just the left outboard flaps 90a that are driven by the one motor 51 are tested with the other sections either deactivated or otherwise not powered during the testing. In other examples, the testing occurs when two or more motors 51 and multiple sections of the actuation system 50 are powered and driving different flaps 90.

For purposes of the example shown in FIG. 4, a single motor 51 is tested. For example, the motor 51 driving the inboard flaps 90b is activated with the motor 51 on the outboard flaps 90a deactivated. The method includes monitoring the current drawn by the electric motor 51 while driving the one or more flaps 90 (block 200). Expected current amounts are previously determined and used as thresholds. These expected amounts are saved in the memory circuitry 62, and accessed by the processing circuitry 61 when performing the testing. The expected current amounts can be based on testing from similar aircraft 100, and/or calculated based on known physical parameters of the actuation system 50. The expected current drawn includes an initial startup period in which the initial deployment overcomes the system inertia. The current draw is then expected to reduce to a sustained current level once system momentum is established. The current drawn during the initial startup period is expected to be higher than the sustaining period. In one example, the current during the initial deployment is ten times (10×) that of the sustained operation. In one specific example, expected current values include an 80 amp inrush current during the initial deployment, followed by an 8.0 amp continuous current. The amount of time necessary for the initial deployment is a known amount that is stored in memory circuitry 62. The expected values and time are based on observed amounts and/or theoretical values that are known prior to the testing. Examples can include the testing during initial deployment happening over a period of between 5.5-7.0 minutes.

The current draw can be detected by one or more sensors 45. The sensors 45, such as ammeters, can be positioned at the motor 51, power source 54, or elsewhere along the electric circuitry.

The sensed amount of current drawn by the electric motor 51 is then compared to a threshold (block 202). This comparison can occur during the initial startup period, during the continuous current period, or a combination of both. In one example, the time period for testing begins at the start of the initial startup period. In another example, the testing is performed repeatedly during operation of the electric motor, while moving the one or more flaps 90.

A current that is not above the threshold indicates that the actuation system 50 is operating properly (block 204). In this situation, the driven components 59 are operating in manner in which the expected amount of current drawn by the electric motor 51 is sufficient to provide the movement. In one example in which the testing is performed in response to an indication of an issue from the indicator system 106, the expected current can indicate an issue with the indicator system 106. In one example, the faulty error indication is caused by one or more of the sensors 30 that detect the position of the one or more flaps 90.

When the current is above the threshold, it is determined that there is an issue with the actuation system 50. Excess current detected is indicative of an excessive amount of friction in the actuation system 50. To determine the one or more causes that produce the increase in frictional interference, a vibrational analysis is performed on one or more of the components 59 of the actuation system 50 (block 206).

Each of the components 59 includes an expected magnitude of vibration during movement. This expected amount can be based on tested data obtained from the aircraft 100 during earlier testing, from testing of similar aircraft, and/or from analyzing the known mechanical aspects and calculating the expected magnitudes. The testing determines the magnitude of the vibrations for the one or more components 59 and compares this against the expected magnitude. A magnitude above the expected amounts indicates an issue with the mechanical component 59.

Figure 5A:
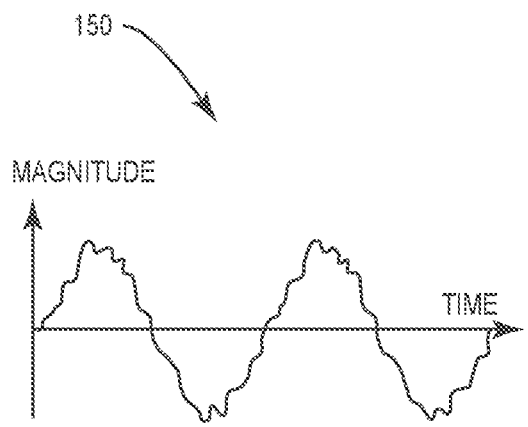
FIG. 5A is a chart of a magnitude of detected vibrations over time.
Figure 5B:
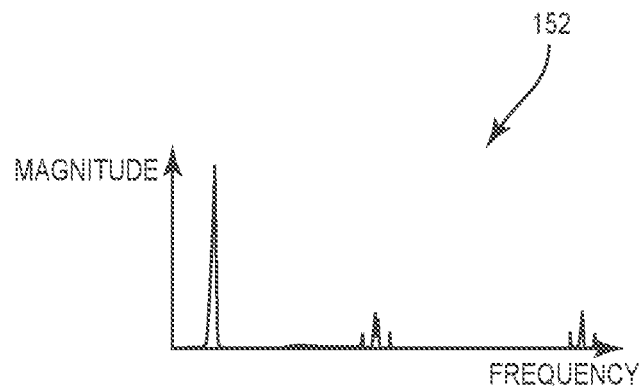
FIG. 5B is a chart of a magnitude of detected vibrations over various frequencies

FIG. 5A schematically illustrates a two-dimensional (or 2-D) graph 150 of the data detected by one or more sensors 40 during movement of the one or more flaps 90. This includes the magnitude of the vibrations over time. FIG. 5B schematically illustrates a second 2-D graph 152 of the data detected during the movement of the flaps 90. This data includes the magnitude of the vibrations at various frequencies.

The data sensed by the one or more sensors 40 is further analyzed through a Fast Fourier Transform (FFT). The FFT divides the vibrations by magnitude over the range of frequencies. Based on the known vibrational frequencies of each of the components 59 and the expected magnitudes of vibration, the testing identifies whether the components 59 are operating within an expected range or whether the components are operating above the expected vibrational magnitudes indicating excessive frictional vibration.

Figure 6:
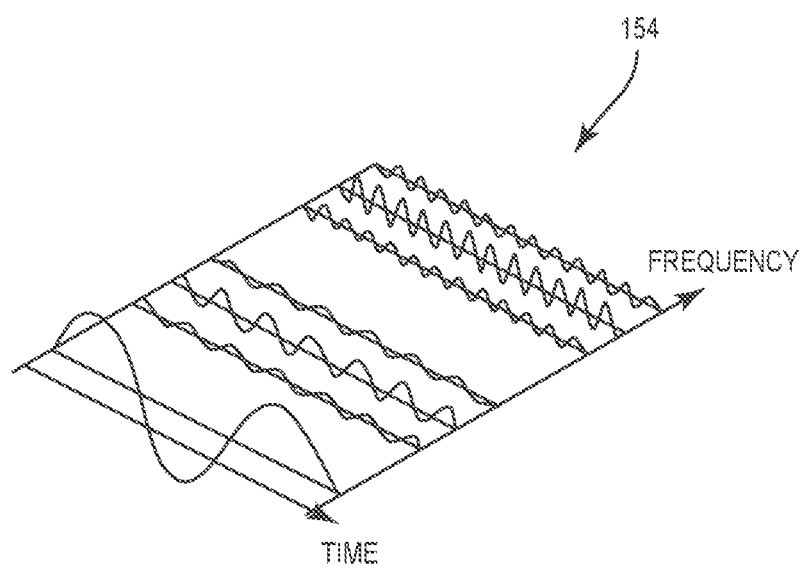
FIG. 6 is a three dimensional chart of a magnitude and frequency of vibrations over time.

The different components 59 vibrate at different frequencies and the testing identifies the individual contributions of the components based on the FFT. In one example, the analysis includes decomposing the Fourier series into the frequencies caused by the components 59. FIG. 6 is the FFT output from the data obtained by the one or more sensors 40 as illustrated in FIGS. 5A and 5B. As illustrated in FIG. 6, the output of the FFT is characterized as a three-dimensional (or 3-D) histogram 154 of the frequency and magnitude of the vibrations over time. This provides for analyzing the separate frequencies within the FFT transform. In the example of FIG. 6, the histogram 154 shows vibrations caused by three separate components 59. In this example, the high amplitude and low frequency vibrations are caused by a first mechanical component 59 (e.g., a bearing defect within the motor 51), a middle frequency is caused by a second mechanical component 59 (e.g., a coupling transmission), and a high frequency is caused by a third mechanical component 59 (e.g., a bearing defect).

The control unit 60 analyzes the output of the FFT and compares the sensed magnitudes of vibration against expected amounts. Based on the comparison, the testing can identify components 59 operating within expected ranges and not causing the increased vibrational interference and those operating outside of the expected ranges and causing the increased frictional interference.

In one example, the data is output to the display that is part of the interface 64 of the control unit 60. The visual display provides information to a technician working on the aircraft 100. In another example, the control unit 60 is configured to analyze the one or more components 59 and to output this to the display or otherwise provide for notification in a manner for the one or more faulty components 59 to be replaced/repaired, and/or the properly functioning components 59 to remain in the aircraft 100.

Figure 7:
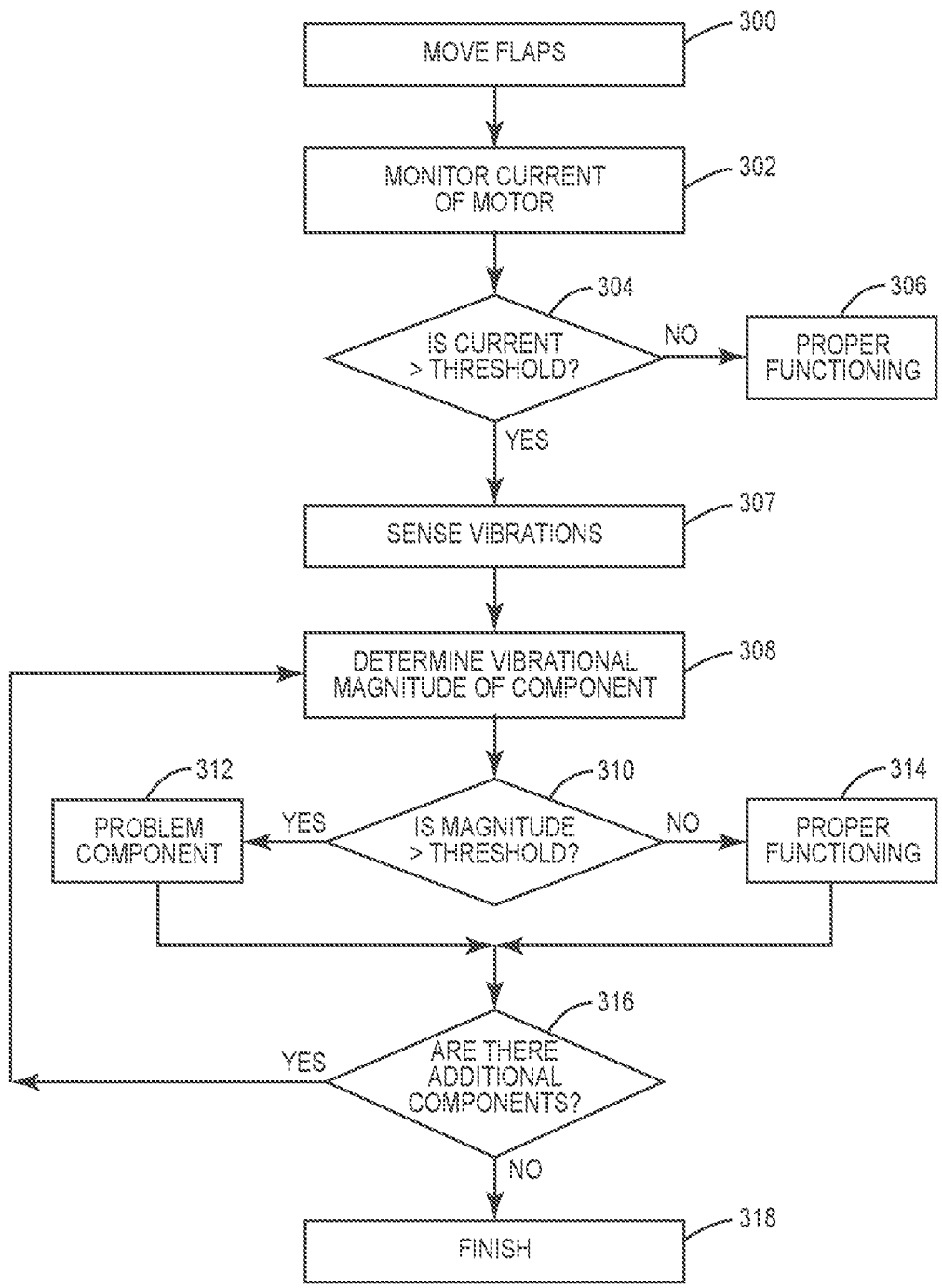
FIG. 7 is a flowchart diagram of a method of detecting frictional interference of one or more components.

FIG. 7 illustrates a method of testing one or more components 59. The testing includes moving one or more of the flaps 90 (block 300) and monitoring the current of the motor 51 (block 302). If the amount of amps drawn by the motor 51 are below a threshold (block 304), the components 59 are properly functioning (block 306). If the current is above the threshold, then vibrational analysis is performed.

Vibrations of the one or more components 59 are sensed while being driven by the motor 51 as the flaps 90 are moving (block 307). The vibration testing can occur at the same time that the current is being tested, or at a different time including after the determination of increased current draw. The vibrational data is analyzed using an FFT to determine a vibrational magnitude of a mechanical component 59 (block 308). The detected vibrational magnitude of the mechanical component 59 is compared against the expected amount (block 310). If the detected magnitude is below the threshold, the mechanical component 59 is operating properly (block 314). If the detected magnitude is above the threshold, the mechanical component 59 is causing excessive vibrational friction and the mechanical component 59 is identified for replacement/repair (block 312). Additional components 59 are tested in a similar manner (block 316) and the testing is finished when the last mechanical component 59 has been analyzed (block 318).

In one example, the testing simultaneously tests two or more components 59. The testing occurs without moving the sensors 40 as their location provides for obtaining vibrational data from the tested components 59. In this testing, the testing can be performed sequentially with a first mechanical component 59 analyzed prior to analyzing a second mechanical component 59. In another example, the testing simultaneously analyzes multiple components 59 and outputs testing results indicating the vibrational magnitude of each of the tested components 59 (e.g., FIG. 6).

In one example, the testing is performed on an individual mechanical component 59. For example, an actuator 53. In this example, one or more sensors 40 are positioned to detect the vibrations of the actuator 53 while moving the flaps 90. The vibrational frequency of the actuator 53 is known and used to determine whether the vibrational magnitude is above a threshold. If yes, then the actuator 53 is determined to be problematic. If no, the actuator 53 is determined to be working properly.

In one example, the vibrational frequency of the individual components 59 is known and used to identify the vibrational magnitude. In another example, the vibrational frequency is not known prior to the testing and is determined based on the testing results. For example, the testing includes a single sensor 40 that is positioned directly on a mechanical component 59. The frequency with the highest magnitude is determined to be the mechanical component 59 due to the sensor location. Other frequency information is caused by other non-tested components 59 and can be removed from the analysis as being noise.

Figure 8:
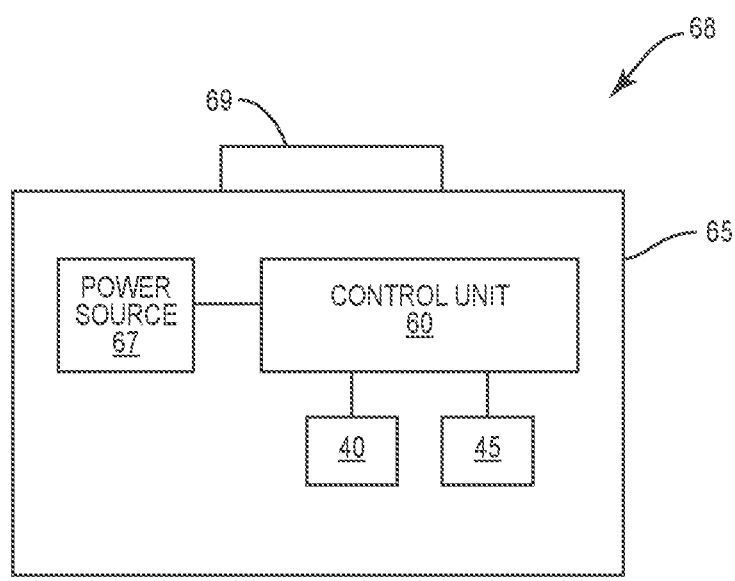
FIG. 8 is a schematic diagram of a testing device.

As described above, the control unit 60 can be integrated in the aircraft 100. In another example, as illustrated in FIG. 8, the control unit 60 is independent from the aircraft 100. FIG. 8 includes an example in which the control unit 60 is part of a testing device 68. The testing device 68 includes an exterior housing 65 that contains the control unit 60. A handle 69 can be attached to the housing 65 to facilitate moving the control unit 60 to different aircraft 100. The sensors 40, 45 are operatively connected to the control unit 60 through wireless communications and/or wired connections. The testing device 68 can also include a power source 67 such as rechargeable batteries for use at remote locations when performing the testing (e.g., on a tarmac when testing an aircraft that is parked at an airport). The control unit 60 can further be communicatively connected to one or more of the flight control system 110, input devices 105, and indicator system 106 to obtain the necessary data to conduct the testing.

One application of the systems and methods is to detect vibrational interference on a flap system of an aircraft 100 as described above. The systems and methods can also be used to detect the vibrational interference caused by one or more components 59 in other vehicle systems. One example includes to detecting vibrational interference of components 59 of a system that positions the slats 90 on the leading edge of the wings 103. Another example is a system in an aircraft 100 that controls both the flaps and slats. Additional examples of components 59 that can be tested on an aircraft 100 include but are not limited to pumps, rotary actuators, linear actuators, fans, and fuel boost and secondary fuel pumps that are each driven by an electric motor.

The testing devices and methods for detecting vibrational interference can be used with a variety of vehicles. One vehicle includes a commercial aircraft 100 as illustrated in FIG. 1. Other vehicles include but are not limited to manned aircraft, unmanned aircraft, manned spacecraft, unmanned spacecraft, manned rotorcraft, unmanned rotorcraft, satellites, rockets, missiles, manned terrestrial aircraft, unmanned terrestrial aircraft, manned surface water borne aircraft, unmanned surface water borne aircraft, manned sub-surface water borne aircraft, unmanned sub-surface water borne aircraft, and combinations thereof.

The present disclosure may be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of detecting frictional interference of one or more mechanical components within a vehicle that are driven by an electric motor, implemented by a frictional interference detection system connected to the vehicle, the method comprising:
   deactivating a hydraulic system that drives the one or more mechanical components and driving the one or more mechanical components with the electric motor;
   receiving a first input from a current sensor that is connected to the electric motor;
   based on the first input, determining that an amount of current drawn by the electric motor while driving the one or more mechanical components is above a predetermined threshold;
   after determining that the amount of current drawn by the electric motor is above the predetermined threshold, receiving a second input from a vibration sensor that is connected to the vehicle;
   based on the second input, determining vibrations caused by the one or more mechanical components while being driven by the electric motor;
   analyzing the vibrations by a Fast Fourier Transform (FFT);
   based on an output from the FFT, determining the frictional interference of the one or more mechanical components of the vehicle; and
   outputting data indicative of the frictional interference.

2. The method of claim 1, further comprising determining the current drawn by the electric motor over an initial period when the one or more mechanical components are first driven by the electric motor.

3. The method of claim 1, further comprising determining an indicator error when the amount of current drawn by the electric motor is below the predetermined threshold.

4. The method of claim 1, wherein detecting the vibrations while the one or more mechanical components are driven by the electric motor comprises detecting the vibrations from one or more 3-axis accelerometers.

5. The method of claim 1, further comprising based on the output from the FFT, identifying the one or more mechanical components based on individual vibrational frequencies.

6. The method of claim 5, further comprising based on the output from the FFT, determining that a magnitude of the individual vibrational frequency of one of the mechanical components is above a predetermined threshold and identifying the mechanical component for replacement.

7. The method of claim 1, further comprising determining that a magnitude of the individual vibrational frequency of the mechanical components is below a predetermined threshold and identifying the mechanical component as acceptable to remain in the vehicle.

8. The method of claim 1, wherein the one or more mechanical components are flight control members on an aircraft.

9. The method of claim 8, further comprising receiving a command from a flight control input located in a cockpit of the aircraft prior to determining the amount of current drawn by the electric motor.

10. A method of detecting frictional interference of mechanical components within a vehicle that are driven by an electric motor, the method implemented by a frictional interference detection system, the method comprising:
receiving an indication from an indicator system onboard the vehicle that an element on the vehicle has one or more of a positioning issue and a timing issue while the element is being driven by an electric motor through the mechanical components;
deactivating a hydraulic system that drives the element with Just the electric motor being able to drive the element;
after receiving the indication and after deactivating the hydraulic system, testing the element with the frictional interference detection system while the electric motor is driving the element with the one or more mechanical components;
receiving current signals from a current sensor and based on the current signals determining an increase in current drawn by the electric motor while driving the one or more mechanical components;
receiving vibration signals from a vibration sensor connected to the mechanical components and analyzing with a Fast Fourier Transform (FFT) the vibrations of the one or more mechanical components while being driven by the electric motor;
based on an output from the FFT, identifying the frictional interference caused by each of the mechanical components based on individual vibrational frequencies; and
outputting the individual vibrational frequencies indicative of the frictional interference.

11. The method of claim 10, further comprising determining that one of the mechanical components is causing the frictional interference to be above a predetermined threshold based on the individual vibrational frequency of the mechanical component.

12. The method of claim 10, further comprising receiving magnitudes and frequencies of the vibrations overtime from one or more 3-axis accelerometers.

13. The method of claim 10, further comprising determining the vibrations of one of the mechanical components based on readings from a sensor that is attached to just the mechanical component.

14. The method of claim 10, further comprising the mechanical components are flight control members of an aircraft.

15. A device to detect frictional interference of moving mechanical components that are driven by an electric motor, the device comprising:
a current sensor configured to be connected to the electric motor;
one or more vibration sensors configured to be connected to the mechanical components;
a control unit comprising processing circuitry and memory circuitry, the control unit configured to:
deactivate a hydraulic system that drives the element;
determine an issue with movement of an element that is driven by the electric motor through the mechanical components;
after determining the issue, testing the element by moving the element with just the electric motor through the mechanical components;
based on the current detected by the current sensor during the testing, detect that current drawn by the electric motor while driving the mechanical components is above a predetermined threshold;
after determining that the current is above the predetermined threshold, receive signals from the one or more vibration sensors indicative of vibrations of the mechanical components that are being driven by the electric motor;
analyze the signals using a Fast Fourier Transform (FFT);
identify the frictional interference caused by each of the mechanical components based on individual vibration frequencies of the mechanical components; and
output the frictional interference to a display;
a housing that extends around the control unit; and
a handle attached to the housing for grasping by a user when transporting the device.

16. The device of claim 15, wherein the one or more vibration sensors are three-axis accelerometers.

17. The device of claim 15, wherein the control unit is further configured to receive an input from a cockpit of the aircraft prior to detecting the current drawn by the electric motor.

18. The method of claim 1, wherein the vehicle is an aircraft and further comprising detecting the frictional interference while the aircraft is on the ground.

19. The method of claim 1, further comprising:
positioning a testing device in proximity to the vehicle;
operatively connecting the testing device to the vehicle; and
determining the amount of current drawn, detecting the vibrations, and analyzing the vibrations with the testing device.

20. The method of claim 1, wherein receiving the second input from the vibration sensor when the vibration sensor is directly connected to one of the components.

* * * * *